United States Patent [19]

Akahoshi et al.

[11] Patent Number: 4,876,177

[45] Date of Patent: Oct. 24, 1989

[54] PROCESS FOR PRODUCING PRINTED CIRCUIT BOARD

[75] Inventors: Haruo Akahoshi, Hitachi; Kanji Murakami, Mito; Mineo Kawamoto; Akio Tadokoro, both of Hitachi; Toyofusa Yoshimura, Ibaraki, all of Japan

[73] Assignee: Hitachi, Ltd., Tokyo, Japan

[21] Appl. No.: 95,921

[22] Filed: Sep. 8, 1987

[30] Foreign Application Priority Data

Sep. 5, 1986 [JP] Japan .................................. 61-207788

[51] Int. Cl.⁴ .......................... B05D 5/12; G03L 5/00
[52] U.S. Cl. .................................... 430/313; 430/319; 430/325; 430/328; 430/330; 430/394; 427/98
[58] Field of Search ............... 430/313, 315, 319, 328, 430/330, 394, 270, 331, 333, 325, 326; 427/98

[56] References Cited

U.S. PATENT DOCUMENTS

| | | | |
|---|---|---|---|
| 3,930,963 | 1/1976 | Polichette et al. | 430/319 |
| 4,216,246 | 8/1980 | Iwasaki et al. | 430/319 |
| 4,456,679 | 6/1984 | Leyrer et al. | 430/330 |
| 4,460,427 | 7/1984 | Haney et al. | 430/330 |
| 4,469,777 | 9/1984 | O'Neil | 427/98 |
| 4,470,883 | 9/1984 | Eichelberger et al. | 427/98 |
| 4,567,062 | 1/1986 | Fan | 430/328 |
| 4,687,730 | 8/1987 | Eron | 430/328 |

Primary Examiner—Jose G. Dees
Assistant Examiner—Donald J. Loney
Attorney, Agent, or Firm—Antonelli, Terry & Wands

[57] ABSTRACT

A process for producing a printed circuit board, which comprises the steps of forming a layer comprising a photosensitive resin composition on an insulating substrate having on its surface an adhesive layer adherent to a metal being subsequently plated thereon; exposing said layer comprising a photosensitive resin composition to an actinic radiation in a manner so as to form on said layer a negative pattern of a conductor circuit pattern and to semicure said negative pattern to an extent sufficient to keep it from erosion by a plating solution; developing by dissolving away with a solvent the uncured areas not exposed to said actinic radiation, thereby to form a plating resist on the areas of said negative pattern; chemically plating said conductor circuit pattern areas not covered with said plating resist, thereby to form a conductor circuit; and carrying out a curing treatment to cure completely said resist. According to this invention, it is possible to provide a printed circuit board of higher reliability compared with conventional processes.

34 Claims, 2 Drawing Sheets

PROCESS FOR PRODUCING PRINTED CIRCUIT BOARD

BACKGROUND OF THE INVENTION

This invention relates to a process for producing a printed circuit board by the additive process employing a photoresist. More particularly, it relates to a process for producing a printed circuit board, which is suitable for the formation of microwiring by the additive process.

Conventionally, as a process for producing a printed circuit board at a low cost, there has been known a so-called additive process wherein a negative pattern is formed by using a plating resist and a circuit is formed by chemical copper plating on the areas not covered by the plating resist. For the dense packaging of such an additive-type printed circuit board, it is effective to utilize a photoresist by employing a photosensitive resin as a plating resist and forming an image by light. In the case of the additive process, as distinguished from the etched foil process or pattern electroplating process in view of process steps, the resist can be left as such after completion of the plating on circuit areas and, hence, the step of resist stripping can be omitted. It is also possible by leaving the resist as such in the substrate areas not carrying conductor wiring to obtain flat surface with no difference between the surface level of conductor areas and that of other areas. There is another advantage in that the perfect coverage of the conductor surface becomes easier in forming a permanent mask for the protection of conductor surface. However, to utilize a photoresist as permanent resist, it is necessary for the photoresist to have, in addition to those image forming characteristics which are generally required for a photoresist, other thermal, chemical, and mechanical stabilities such as soldering resistance, solvent resistance, and heat shock resistance. A process for making a printed wiring board using a photosensitive resin which meets the above requirements is described in Japanese Pat. application "Kokai" (Laid-open) No. 100,490/83. In forming a resist pattern by use of a photosensitive resin, an exposure to form the image is insufficient for complete curing of the resin and it is difficult to meet the above requirements of thermal, chemical and mechanical stabilities. As a consequence, it has generally been believed to be effective that after having been formed by development, the resist pattern is further subjected to treatments such as heating, exposure and the like to cure completely the photosensitive resin.

When a photoresist is used in the additive process, it has been general practice to carry out, prior to the chemical copper plating, the post exposure and post heat treatment in succession to the imagewise exposure and development as a sequence of image forming process steps. The reason for this is such that it was thought necessary to enhance the plating resistance of the photoresist by post exposure prior to the chemical copper plating. However, it has become apparent that if such a technique is used in the case of full additive process by carrying out the post exposure prior to the chemical copper plating, there arise such problems that (1) plating void is likely to result and (2) the adhesion strength between the deposited copper film and the substrate becomes decreased.

SUMMARY OF THE INVENTION

The first object of this invention is to improve the thermal, chemical and mechanical stabilities by thoroughly curing the photoresist without giving rise to the problems of plating void or reduced adhesion between the deposited metal and the substrate.

There has been known a process in which the photoresist composition is incorporated with a leuco triphenylmethane dye and an organic polyhalogen compound for the purpose of rendering visible the exposed image areas of the photoresist by coloring after the exposure, thereby to improve the operation of exposure. However, when the photoresist incorporated with these compounds is used in the additive process and the post exposure treatment is carried out prior to the chemical copper plating in order to improve the chemical and mechanical stabilities of the resist, there arises a problem of severe pollution of the plating solution by the photoresist. This problem is not only associated with the full additive process but also is common to additive processes in which through-holes or circuits are chemically plated with copper by use of the photoresist as plating resist.

The second object of this invention, therefore, is to avoid pollution of the chemical copper plating solution caused by the photoresist even when the photoresist is incorporated with a leuco triphenylmethane dye and an organic polyhalogen compound. The leuco triphenylmethane dyes include Crystal Violet Lactone, Benzoyl Leuco Methylene Blue, and Leuco Crystal Violet. As polyhalogen compounds, there may be used compounds having three or more halogen (Br, I or Cl) atoms combined with the same carbon atom, such as pentabromoethane, tribromomethylphenylsulfone, tribromoacetamide, and tribromophenylsulfone.

As a result of an extensive study to achieve the above objects, the present inventors found that the above objects are achieved by carrying out the exposure to cure the photoresist, that is, the post exposure, subsequent to, instead of prior to, the chemical copper plating and that the photoresist is not particularly injured even when the post exposure is not performed prior to the chemical copper plating.

The present invention of the process for producing a printed circuit board has been accomplished based on the above discovery. The process is characterized by comprising:

(1) the step of forming a layer of a photosensitive resin composition on a substrate, and carrying out a development treatment, thereby to form a plating resist, (2) the step of carrying out selective chemical plating on the areas not covered by the plating resist, thereby to form a conductor circuit, and (3) the step of exposing again the plating resist to actinic radiation after completion of said chemical plating, thereby to complete the curing of the plating resist.

In the additive process, in order to deposit the chemically plated copper on the substrate, a plating catalyst is allowed to adhere to the substrate surface or is dispersed in the substrate material. The reason for the occurrence of plating void when the post exposure is performed prior to the chemical copper plating seems to be the reduction in the activity of plating catalyst caused by the strong ultraviolet rays in the post exposure step.

The reduction in adhesion seems to be due to the deterioration in the surface of adhesive layer provided to enhance the adhesion between the copper film and substrate, said deterioration being caused by the strong ultraviolet rays in post exposure. The above problems can be avoided by carrying out the post exposure treatment after completion of the chemical plating and it becomes possible to utilize the photoresist as permanent resist, thereby to secure chemical and mechanical stabilities.

When a photoresist containing a leuco triphenylmethane dye and a polyhalogen compound is subjected to post exposure treatment prior to the plating, the pollution of plating solution becomes marked. The reason for this seems to be due to a high polluting effect of the photoreaction products of the aforementioned compounds on the chemical copper plating solution. Thereafter, the problem of pollution of the chemical copper plating solution by photoresist can be avoided by carrying out the post exposure after the chemical copper plating.

In carrying out the process of this invention, since the plating resist of photosensitive resin is cured after the formation of circuit by chemical copper plating, there is formed a slight clearance between the plating resist and the copper circuit due to shrinkage of the cured resin. This clearance, however, does no practical harm because common printed circuit boards are further provided with a permanent resist such as solder resist on the top surface. As the solder resist, there can be used a photosensitive resin or a photosensitive film.

Besides, in the case a preparing a printed wiring board by the full additive process, in handling a substrate with adhered plating catalyst after formation of a resist pattern, there sometimes occurs unintended contact of jigs or other tools with the circuit pattern-forming areas bearing the catalyst. If such jigs or other tools again come in contact with the resist surface, the catalyst is transferred onto the resist surface and brings about an undesirable phenomenon of deposition of copper on the resist during the chemical copper plating. For instance, in the conventional process steps shown in FIG. 2, the substrate after development is sent to a post exposure equipment by means of a transport conveyor and there often occurs sliding contact of the substrate surface with the conveyor, resulting in transfer of the catalyst. According to this invention, the post exposure treatment is performed after the chemical copper plating and the transfer of plating catalyst, which is accompanied by the post exposure treatment, can be avoided.

In the process of this invention, a dry film photoresist as well as a liquid photoresist can be applied in the same way.

DETAILED DESCRIPTION OF PREFERRED EMBODIMENTS

EXAMPLE 1

Figure 1:
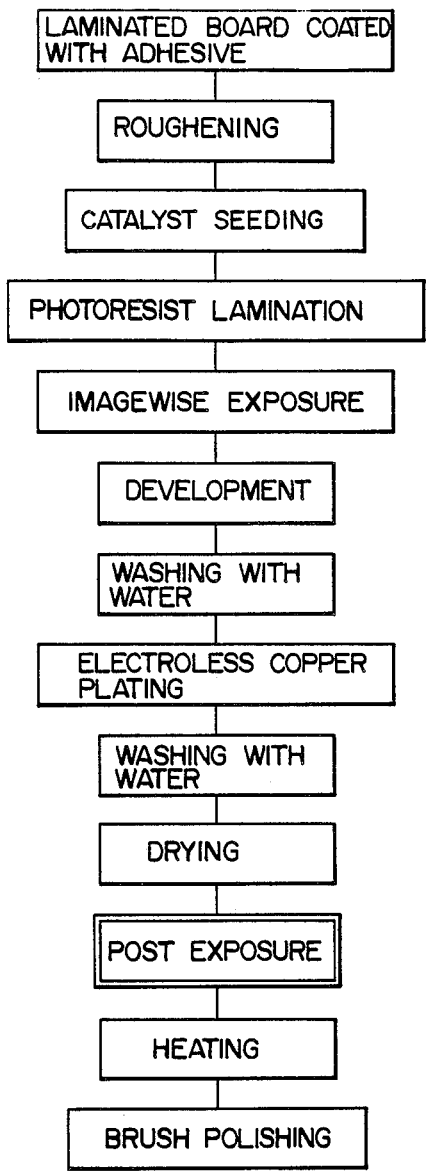
FIG. 1 is a flow diagram representing the process steps in one Example according to this invention.
Figure 2:
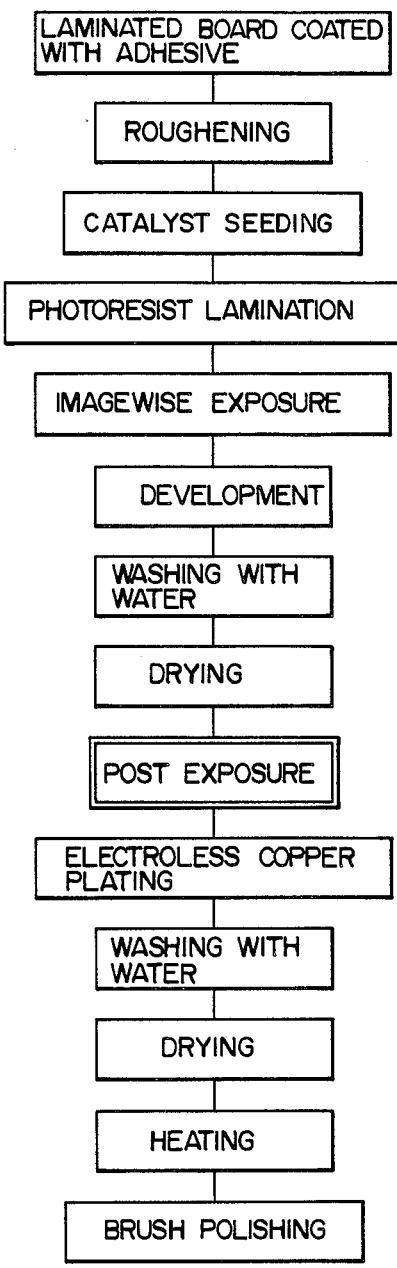
FIG. 2 is a flow diagram representing the steps of a conventional process.

A phenol resin laminated board, 1.6 mm in thickness, was coated on both sides with an adhesive comprising as principal constituent a phenol resin modified with an acrylonitrile-butadiene rubber and the adhesive was cured by heating at 160° C. for 110 minutes to yield a laminated board provided with adhesive layers, each about 30 $\mu$m in thickness. Holes were drilled through prescribed positions of the resulting board and the surfaces of both adhesive layers were roughened by dipping in a roughening solution containing chromic anhydride and sulfuric acid. The board was dipped for 3 minutes in an aqueous acidic solution containing as chemical copper plating catalyst a sensitizer, HS 101B from Hitachi Chemical Co., then washed with water, treated for 3 minutes with an accelerator solution containing dilute hydrochloric acid as principal constituent, washed with water, and dried at 120° C. for 20 minutes.

The substrate board thus treated was laminated on both sides with a dry film photoresist, SR-3000-35 from Hitachi Chemical Co., then covered tightly with a test negative mask, exposed at 150 mJ/cm$^2$ by using an exposure apparatus, Type HMW-201 KB from ORC Seisakusho Co., and heated at 80° C. for 5 minutes.

The resulting test substrate board having a resist pattern of a photosensitive resin formed thereon was subjected to chemical copper plating by dipping at 70° C. for 12 hours in a chemical copper plating solution of the following composition, thereby to deposit copper, about 30 $\mu$m in thickness, on the pattern areas. After completion of the plating, the resulting board was washed with water and dried at 80° C. for 20 minutes.

| Composition of plating solution | |
|---|---|
| | Per liter |
| Copper sulfate, pentahydrate | 10 g |
| Ethylenediaminetetraacetic acid | 30 g |
| 37%-Formalin | 3 ml |
| pH (adjusted with NaOH) | 12.5 |
| Polyethylene glycol (Molecular weight, 600) | 20 ml |
| 2,2'-Dipyridyl | 30 mg |

Using an ultraviolet irradiation apparatus having a high-pressure mercury lamp as light source, the board was exposed to ultraviolet rays at 5 J/cm$^2$. The board was then heat treated at 165° C. for 40 minutes. The pattern areas of the printed wiring board thus obtained was inspected for plating void. The peal strength of the deposited copper film was tested on a test pattern of 10 mm in breadth and 100 mm in length. A test specimen was immersed in a solder bath at 260° C. for 5 seconds, then subjected to a heat shock test under conditions B ($-65°$ C., 30 min. ⇌room temp., 5 min. ⇌125° C, 30 min.) of MIL-STD-202E 107D, and inspected for the lifting of the resist film and cracks.

The peel strength of the chemically deposited metal film was as good as 2.5–2.7 kgf/cm and no plating void was observed. The resist film showed no cracking or lifting. It has been confirmed that a high-density printed wiring board can be produced by the process of this invention.

Further, after having been cured, the plating resist was overcoated with a solder resist (UVR-150G of Taiyo Ink Co.) by screen printing and was cured by exposing to ultraviolet rays at 0.52 J/cm$^2$. After curing, the board was subjected to the heat shock test performed in the same manner as described above. After 100 cycles of repeated test, neither cracking nor lifting was observed.

EXAMPLE 2

A printed wiring board was prepared in the same manner as in Example 1, except that Laminar GSI of Dynachem Co. was used in place of the dry film photoresist used in Example 1. The film deposited by plating showed a peel strength of 2.6-2.7 kgf/cm and no plating void was observed. After 50 cycles of repeated heat shock test, neither cracking nor lifting was observed on the resist.

EXAMPLE 3

A printed wiring board was prepared in the same manner as in Example 1, except that a dry film photoresist containing 0.9 part by weight of Leuco Crystal Violet and 1.5 parts by weight of tribromophenylsulfone was used in place of the dry film photoresist used in Example 1. The chemically deposited film showed a peel strength of 2.6-2.8 kgf/cm and no plating voids were observed. After a total of 16 dm$^2$ of resist had been immersed in one liter of the plating solution for 10 hours or more, a chemically deposited film having an elongation of 12% or more was obtained, indicating no pollution of the plating solution.

COMPARATIVE EXAMPLE 1

In a manner similar to that in Example 1, a photoresist was laminated on a substrate coated with an adhesive. The substrate board was then exposed, developed and exposed to ultraviolet rays from a high-pressure mercury lamp at 5 J/cm$^2$ to cure completely. Then the board was subjected to chemical copper plating as in Example 1, washed with water, dried at 80° C. for 20 minutes, and heat treated at 165° C. for 40 minutes. Upon observation of the pattern areas of the resulting printed circuit board, there were found local plating voids. The chemically deposited film showed a low peel strength of 0.6 -1.5 kgf/cm.

COMPARATIVE EXAMPLE 2

In a manner similar to that in Example 2, a photoresist was laminated on a substrate coated with an adhesive. The substrate board was then exposed, developed, and subjected to chemical copper plating. The board was washed with water, dried at 80° C. for 20 minutes, and heat treated at 165° C. for 40 minutes without preceding exposure to a high-pressure mercury lamp. Neither plating voids nor a decrease in peel strength was observed. However, upon observation of the resist surface after 50 cycles of heat shock test under the conditions as described in Example 1, there were found cracks and local lifting of the resist film.

COMPARATIVE EXAMPLE 3

In a manner similar to that in Example 3, a photoresist was laminated on a substrate coated with an adhesive, then exposed and developed. Thereafter, prior to the chemical copper plating, the substrate board was exposed to ultraviolet rays at 5 J/cm$^2$ by means of an ultraviolet irradiation apparatus having a high-pressure mercury lamp as light source. The substrate board was then subjected to chemical copper plating, washed with water, dried at 80° C. for 20 minutes, and heat treated at 165° C. for 40 minutes. The printed wiring board thus prepared showed local plating voids in the wiring pattern. The chemically deposited copper film showed a low peel strength of 0.7 -1.3 kgf/cm. When a printed wiring board was prepared by such a procedure, after a total of 40 dm$^2$ of resist had been immersed in one liter of the plating solution for 10 hours, the elongation of the chemically deposited copper film decreased to 3% or below, indicating pollution of the plating solution.

The results of test for plating voids, cracking in the resist after heat shock, pollution of the plating solution, and peel strength obtained in Examples 1 to 3 and Comparative Examples 1 to 3 were as summarized in Table 1.

TABLE 1

|  |  | Plating voids | Peel strength (kgf/cm) | Cracking in resist after heat shock* | Pollution of plating solution |
|---|---|---|---|---|---|
| Example | 1 | No | 2.5-2.7 | No | — |
|  | 2 | No | 2.6-2.7 | No | — |
|  | 3 | No | 2.6-2.8 | No | No |
| Comparative Example | 1 | Yes | 0.6-1.5 | No | — |
|  | 2 | No | 2.6-2.7 | Yes | — |
|  | 3 | Yes | 0.7-1.3 | No | Yes |

Note: *MIL-STE-202E-Method 107D, Condition B, after 50 cycles.

As is apparent from the results shown in Table 1, according to the present invention, it is possible to improve chemical and mechanical stabilities of the photoresist without causing occurrence of plating voids or deterioration in peel strength of the chemically deposited copper film.

Further, according to the present invention, it is possible to avoid pollution of the chemical copper plating solution by the photoresist even when the resist is incorporated with leuco triphenylmethane dyes and polyhalogen compounds.

What is claimed is:

1. A process for producing a printed circuit board, which comprises the steps of:
   forming a layer comprising a photosensitive resin composition on an insulating substrate having on its surface an adhesive layer adherent to a metal being subsequently plated thereon;
   exposing said layer comprising a photosensitive resin composition to an actinic radiation in a manner so as to form on said layer a negative pattern of a conductor circuit pattern and to semicure said negative pattern to an extent sufficient to keep it from erosion by a plating solution;
   developing by dissolving away with a solvent the uncured areas not exposed to said actinic radiation, thereby to form a plating resist from the semicured areas of said negative pattern;
   chemically plating said conductor circuit pattern areas not covered with said plating resist, thereby to form a conductor circuit; and
   carrying out a curing treatment to cure completely said plating resist by exposing to actinic radiation.

2. A process for producing a printed circuit board according to claim 1, wherein the curing treatment of the resist after the plating is carried out by exposing to an actinic radiation and heating.

3. A process for producing a printed circuit board according to claim 1, wherein the photosensitive resin composition is a resin composition curable by ultraviolet rays and the actinic radiation is the ultraviolet rays.

4. A process for producing a printed circuit board according to claim 1, wherein the photosensitive resin composition is in the form of film.

5. A process for producing a printed circuit board, which comprises the steps of:
   forming a layer comprising a photosensitive resin composition on an insulating substrate having on its surface an adhesive layer adherent to a metal being subsequently plated thereon;

exposing said layer comprising a photosensitive resin composition to an actinic radiation in a manner so as to form on said layer a negative pattern of a conductor circuit pattern and to semicure said negative pattern to an extent sufficient to keep it from erosion by a plating solution;

developing by dissolving away with a solvent the uncured areas not exposed to said actinic radiation, thereby to form a plating resist from the semicured areas of said negative pattern;

chemically plating said conductor circuit pattern areas not covered with said plating resist, thereby to form a conductor circuit;

carrying out a curing treatment to cure completely said plating resist by exposing to actinic radiation; and forming a solder resist on said plating resist and on said circuit.

6. A process for producing a printed circuit board according to claim 5, wherein the curing treatment of the plating resist after the plating is carried out by exposing to an actinic radiation and heating.

7. A process for producing a printed circuit board according to claim 5, wherein the photosensitive resin composition is a resin composition curable by ultraviolet rays and the actinic radiation is the ultraviolet rays.

8. A process for producing a printed circuit board according to claim 5, wherein the photosensitive resin composition is in the form of film.

9. A process for producing a printed circuit board according to claim 5, wherein the solder resist comprises a photosensitive resin composition and is curable by exposing to an actinic radiation.

10. A process for producing a printed circuit board, which comprises the steps of:
forming a layer comprising a photosensitive resin composition on an insulating substrate having on its surface an adhesive layer adherent to a metal being subsequently plated thereon;

exposing said layer comprising a photosensitive resin composition to an actinic radiation in a manner so as to form on said layer a negative pattern of a conductor circuit pattern and to semicure said negative pattern to an extent sufficient to keep it from erosion by a plating solution;

developing by dissolving away with a solvent the uncured areas not exposed to said actinic radiation, thereby to form a plating resist from the semicured areas of said negative pattern;

chemically plating said conductor circuit pattern areas not covered with said plating resist, thereby to form a conductor circuit;

forming a second photosensitive resin layer in a pattern on said plating resist and on said conductor circuit; and curing completely the photosensitive resin layers to form a solder resist by exposing to actinic radiation.

11. A process for producing a printed circuit board according to claim 10, wherein the curing treatment of the photosensitive resin layers after the plating is carried out by exposing to an actinic radiation and heating.

12. A process for producing a printed circuit board according to claim 10, wherein the photosensitive resin composition is a resin composition curable by ultraviolet rays and the actinic radiation is the ultraviolet rays.

13. A process for producing a printed circuit board according to claim 10, wherein the photosensitive resin layer is in the form of film.

14. A process for producing a printed circuit board according to claim 10, wherein the second photosensitive resin layer is in the form of film.

15. A process for producing a printed circuit board, which comprises the steps of:
forming a layer comprising a photosensitive resin composition containing at least one triphenylmethane dye and at least one polyhalogen compound on an insulating substrate having on its surface an adhesive layer adherent to a metal being subsequently plated thereon;

exposing said layer comprising a photosensitive resin composition to an actinic radiation in a manner so as to form on said layer a negative pattern of a conductor circuit pattern and to semicure said negative pattern to an extent sufficient to keep it from erosion by a plating solution;

developing by dissolving away with a solvent the uncured areas not exposed to said actinic radiation, thereby to form a plating resist from the semicured areas of said negative pattern;

chemically plating said conductor circuit pattern areas not covered with said plating resist, thereby to form a conductor circuit; and carrying out a curing treatment to cure completely said plating resist by exposing to actinic radiation.

16. A process for producing a printed circuit board according to claim 15, wherein the curing treatment of the resist after the plating is carried out by exposing to an actinic radiation and heating.

17. A process for producing a printed circuit board according to claim 15, wherein the photosensitive resin composition is a resin composition curable by ultraviolet rays and the actinic radiation is the ultraviolet rays.

18. A process for producing a printed circuit board according to claim 15, wherein the photosensitive resin composition is in the form of film.

19. A process for producing a printed circuit board according to claim 15, wherein said triphenylmethane dye is at least one dye selected from the group consisting of Crystal Violet Lactone, Benzoyl Leuco Methylene Blue, and Leuco Crystal Violet.

20. A process for producing a printed circuit board according to claim 15, wherein said polyhalogen compound is at least one compound selected from the group consisting of pentabromoethane, tribromomethylphenysulfone, tribromoacetamide, and tribromophenylsulfone.

21. A process for producing a printed circuit board, which comprises the steps of:
forming a layer comprising a photosensitive resin composition containing at least one triphenylmethane dye and at least one polyhalogen compound on an insulating substrate having on its surface an adhesive layer adherent to a metal being subsequently plated thereon;

exposing said layer comprising a photosensitive resin composition to an actinic radiation in a manner so as to form on said layer a negative pattern of a conductor circuit pattern and to semicure said negative pattern to an extent sufficient to keep it from erosion by a plating solution;

developing by dissolving away with a solvent the uncured areas not exposed to said actinic radiation, thereby to form a plating resist from the semicured areas of said negative pattern;

chemically plating said conductor circuit pattern areas not covered with said plating resist, thereby to form a conductor circuit;

carrying out a curing treatment to cure completely said plating resist by exposing to actinic radiation; and forming a solder resist on said plating resist.

22. A process for producing a printed circuit board according to claim 21, wherein the curing treatment of the plating resist after the plating is carried out by exposing to an actinic radiation and heating.

23. A process for producing a printed circuit board according to claim 21, wherein the photosensitive resin composition is a resin composition curable by ultraviolet rays and the actinic radiation is the ultraviolet rays.

24. A process for producing a printed circuit board according to claim 21, wherein the photosensitive resin composition is in the form of film.

25. A process for producing a printed circuit board according to claim 21, wherein the solder resist comprises a photosensitive resin composition and is cured by the exposure to an actinic radiation.

26. A process for producing a printed circuit board according to claim 21, wherein said triphenylmethane dye is at least one dye selected from the group consisting of Crystal Violet Lactone, Benzoyl Leuco Methylene Blue, and Leuco Crystal Violet.

27. A process for producing a printed circuit board according to claim 21, wherein said polyhalogen compound is at least one compound selected from the group consisting of pentabromoethane, tribromomethylphenylsulfone, tribromoacetamide, and tribromophenylsulfone.

28. A process for producing a printed circuit board, which comprises the steps of:

forming a layer comprising a photosensitive resin composition containing at least one triphenylmethane dye and at least one polyhalogen compound on an insulating substrate having on its surface an adhesive layer adherent to a metal being subsequently plated thereon;

exposing said layer comprising a photosensitive resin composition to an actinic radiation in a manner so as to form on said layer a negative pattern of a conductor circuit pattern and to semicure said negative pattern to an extent sufficient to keep it from erosion by a plating solution;

developing by dissolving away with a solvent the uncured areas not exposed to said actinic radiation, thereby to form a plating resist from the semicured areas of said negative pattern;

chemically plating said conductor circuit pattern areas not covered with said plating resist, thereby to form a conductor circuit;

forming a second photosensitive resin layer in a pattern on said plating resist and on said conductor circuit; and curing completely the photosensitive resin layers to form a solder resist by exposing to actinic radiation.

29. A process for producing a printed circuit board according to claim 28, wherein the curing treatment of the photosensitive resin layers after the plating is carried out by exposing to an actinic radiation and heating.

30. A process for producing a printed circuit board according to claim 28, wherein the photosensitive resin composition is a resin composition curable by ultraviolet rays and the actinic radiation is the ultraviolet rays.

31. A process for producing a printed circuit board according to claim 28, wherein the photosensitive resin composition is in the form of film.

32. A process for producing a printed circuit board according to claim 28, wherein the second photosensitive resin layer is in the form of film.

33. A process for producing a printed circuit board according to claim 28, wherein said triphenylmethane dye is at least one dye selected from the group consisting of Crystal Violet Lactone, Benzoyl Leuco Methylene Blue, and Leuco Crystal Violet.

34. A process for producing a printed circuit board according to claim 28, wherein said polyhalogen compound is at least one compound selected from the group consisting of pentabromoethane, tribromomethylphenysulfone, tribromoacetamide, and tribromophenylsulfone.

* * * * *